United States Patent [19]

Nagashima et al.

[11] 4,412,377

[45] Nov. 1, 1983

[54] METHOD FOR MANUFACTURING A HYBRID INTEGRATED CIRCUIT DEVICE

[75] Inventors: Kenji Nagashima, Tokyo; Hiroshi Matsumoto, Yokohama; Masataka Tanaka, Kitakyushu; Hirosi Oodaira, Chigasaki; Nobuo Iwase, Yokosuka, all of Japan

[73] Assignee: Tokyo Shibaura Denki Kabushiki Kaisha, Kawasaki, Japan

[21] Appl. No.: 341,589

[22] Filed: Jan. 21, 1982

[30] Foreign Application Priority Data

Jan. 23, 1981 [JP] Japan .................................... 56-8758

[51] Int. Cl.$^3$ .......................... H05K 3/34; H01L 21/84
[52] U.S. Cl. .................................... 29/577 C; 29/589; 29/840; 427/34; 427/96; 427/126.2; 427/126.4; 427/259; 427/423
[58] Field of Search ................ 427/34, 96, 423, 126.2, 427/126.4, 259; 29/577 C, 589, 840

[56] References Cited

U.S. PATENT DOCUMENTS 4,031,268  6/1977  Fairbairn ............................... 427/34
4,119,480  10/1978  Nishi ..................................... 427/96

OTHER PUBLICATIONS

MacKay and Miller, "Plasma-Sprayed Dielectric Coatings for Heat Sinks in Electronic Packaging," Ceramic Bulletin, vol. 46, No. 9, pp. 833–836 (1967).

Downer, Alnst and Smyth, "Arc Plasma Sprayed Electrical Circuits and Sputtering Targets," Seventh International Metal Spraying Conference, London, pp. 199–207 (1973).

Harris and Janowiechi, "Arc-Plasma Deposits May Yield some Big Microwave Dividends," Electronics, Feb. 2, 1970, pp. 108–115.

Primary Examiner—John D. Smith
Attorney, Agent, or Firm—Finnegan, Henderson, Farabow, Garrett & Dunner

[57] ABSTRACT

A method for manufacturing a hybrid integrated circuit device comprising a step of forming an $Al_2O_3$ layer on a metal substrate, a step of forming on the $Al_2O_3$ layer a resist layer having a pattern opposite to that of a copper layer which will be formed on the $Al_2O_3$ layer by a later step, a step of forming the copper layer on the $Al_2O_3$ layer using the resist layer as a mask, a step of impregnating thermosetting material into both the $Al_2O_3$ layer and the copper layer, and a step of providing at least one semiconductor element on the copper layer.

6 Claims, 14 Drawing Figures

F I G. 5F 
F I G. 5G 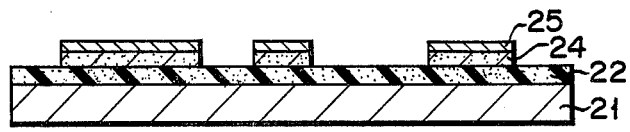
F I G. 5H 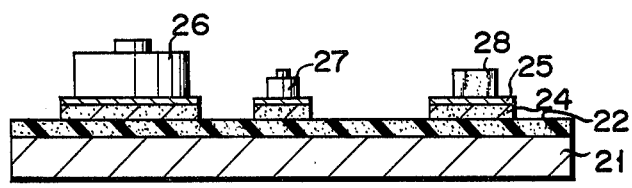
F I G. 6 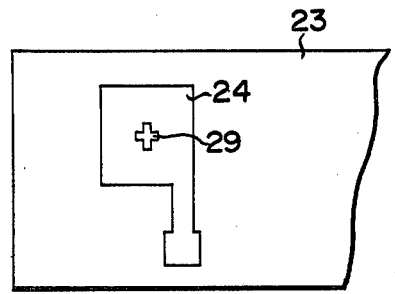
F I G. 7 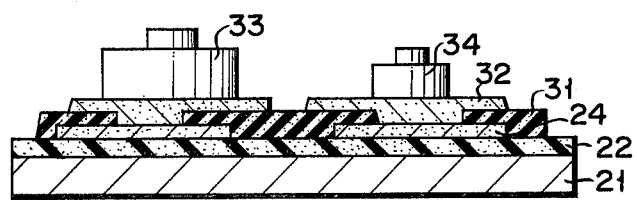

METHOD FOR MANUFACTURING A HYBRID INTEGRATED CIRCUIT DEVICE

BACKGROUND OF THE INVENTION

The present inventon relates to a method for manufacturing a hybrid integrated circuit device.

As the base plate for use to the hybrid integrated circuit device, is conventionally well-known the one as shown in FIG. 1. The conventional base plate is manufactured by printing a desirably patterned paste of Ag-Pb system on a ceramic substrate 1, sintering it at a high temperature of 700° C.–800° C. to form a conductive layer 2, and further printing and sintering, if necessary, a paste of RuO$_2$ (ruthenium oxide) system at desired areas thereon to form a resistive layer 3.

In the case where a power element 4 having large power loss is mounted, as shown in FIG. 2, on the base plate thus formed, a large amount of heat is generated. The entire device must be therefore designed to have an excellent heat radiating characteristic to prevent the device from being damaged by the heat generated. In this case, therefore, a heat radiating metal plate 5 is attached to the back side of ceramic substrate 1 using an adhesive layer 6 such as solder and resin, as shown in FIG. 2. In the case of a hybrid integrated circuit device having such arrangement as shown in FIG. 2, heat generated by the power element 4 cannot be radiated enough by attaching a metal plate to the backside of the substrate. In addition, the conductive layer 2 must be made of noble metal such as Ag-Pb and a different ceramic substrate 1 and heat radiating metal plate 5 must be prepared, thus making the cost of the device high.

Another base plate as shown in FIG. 3 which has the ceramic substrate and heat radiating metal plate formed integral to each other is also provided conventionally. Namely, this base plate is manufactured by flame-spraying a ceramic layer 12 on a heat radiating metal plate 11 and forming a desirably patterned conductive layer 13 on the flame-sprayed ceramic layer 12. In the case of forming the ceramic layer 12 by flame-spraying as described above, the ceramic layer 12 can be formed extremely thin to have a thickness of 100-500μ, thus enabling excellent heat radiating effect to be attained.

Providing that the quantity of heat conducted through a material is represented by Q, the quantity Q of heat is generally expressed as follows:

$$Q = \frac{K \cdot A \cdot \Delta T}{\Delta X} \quad (1)$$

wherein Q represents the quantity of heat conducted, K a heat conductivity, A an area where heat is conducted, ΔX the thickness of material, and ΔT a temperature difference between both ends of thickness ΔX. When equation (1) is modified, $$\Delta T = \frac{\Delta X}{K \cdot A} \cdot Q \quad (2)$$

when $$\frac{\Delta X}{K \cdot A} = Rth$$

and this Rth is regarded as heat resistance, it will be understood that the smaller this heat resistance Rth is, the better the heat conductivity becomes.

Heat resistance Rth can be calculated as follows in both cases where the base plate shown in FIG. 2 has the ceramic substrate 1 made of Al$_2$O$_3$ with a thickness of 0.63 mm and the adhesive layer 6 made of epoxy resin with a thickness of 0.020 mm; and where the base plate shown in FIG. 3 has the ceramic layer 12 made of Al$_2$O$_3$ with a thickness of 0.1 mm, providing that the heat conductivity of Al$_2$O$_3$ by which the ceramic substrate 1 of base plate shown in FIG. 2 is formed is 0.260 W/cm° C., that the heat conductivity of flame-sprayed Al$_2$O$_3$ by which the ceramic layer 12 of base plate shown in FIG. 3 is formed is 0.026 W/cm° C., and that the heat conductivity of epoxy resin 6 in the base plate of FIG. 2 is 0.0035 W/cm° C. Heat resistance Rth due to the ceramic substrate 1 and adhesive layer 6 in the base plate shown in FIG. 2 under these conditions is:

$$Rth = \frac{\Delta X}{K \cdot A} = \frac{0.63}{0.26A} + \frac{0.002}{0.0035A} = \frac{0.814}{A}$$

Heat resistance Rth of ceramic layer 12 in the base plate shown in FIG. 3 is:

$$Rth = \frac{\Delta X}{K \cdot A} = \frac{0.01}{0.026A} = \frac{0.38}{A}$$

Therefore, the ratio of heat resistance of base plate having such arrangement as shown in FIG. 3 relative to that of base plate having such arrangement as shown in FIG. 2 is:

$$\frac{0.38}{A} / \frac{0.814}{A} \simeq \frac{47}{100} \simeq \frac{1}{2}$$

Namely, the heat resistance of base plate shown in FIG. 3 is less than half the heat resistance of base plate shown in FIG. 2. In other words, the base plate shown in FIG. 3 is more than two times better in heat radiating capacity than the base plate shown in FIG. 2.

A conductive layer 13 shown in FIG. 4 is formed on the ceramic layer 12 of base plate excellent in heat radiating characteristic and shown in FIG. 3. The methods of forming the conductive layer 13 include (1) printing Cu paste of resin base, (2) electroless-plating Cu, Ni and so on and (3) flame-spraying Cu. Method (1) enables sintering to be achieved in atmosphere and at a relatively low temperature (120° C.–150° C.). The conductive layer thus formed according to method (1) is therefore inexpensive, but weak relative to mechanical impact. Method (2) makes the cost high and is unpractical. Method (3) can be relatively easily carried out similarly to the spraying of ceramic and is inexpensive. It is therefore most desirable to form the conductive layer 13 according to method (3) of flame-spraying Cu.

Conventional method (3), however, causes a problem on the strength with which the flame-sprayed Cu layer 13 adheres to the ceramic layer 12. Because the ceramic layer 12 is formed by flame-spraying, through pores are present among ceramic material particles which form the ceramic layer 12, and cause the insulating resistance or the dielectric strength of ceramic layer 12 to be lowered. Even if Cu layer 13 is flame-sprayed on the ceramic layer 12 to avoid it, the insulating resistance thereof becomes extremely small when used for a long time under severe conditions or when left for a long time in an atmosphere at a temperature of 60° C. and a humidity of 90%, for example. In order to solve this problem, it is necessary to fill through pores in the ceramic layer 12. The ceramic layer 12 is therefore conventionally immersed with a thermosetting resin to fill through pores therein. Thermosetting resins employed to fill through pores are required to have such characteristics that their viscosity is low and their processability is excellent; that no solvent is needed to lower their viscosity; and that their thermosetting temperature is low and their thermosetting time is short. Resins to meet these requirements are thermosetting resins including epoxy resin, thermosetting acrylic resin, thermosetting polyurethane resin, diaryl phthalate resin, thermosetting polybutadiene resin, silicone resin, thermosetting polyimide resin, bismaleimide resin and so on. Some of these resins may be mixed with one another or one of these resins may be blended with a multifunctionality monomer of low molecular weight.

When the conductive layer 13 is formed by flame-sprayed Cu on the ceramic layer 12 to which the through pores filling process has been added using one of these resins, however, the strength with which the conductive layer 13 adheres to the ceramic layer 12 becomes extremely low. It is because the surface of ceramic layer 12 to which the through pores filling process has been added becomes so smooth with the resin immersed as to cause difficulty in depositing the flame-sprayed copper on the surface of ceramic layer 12. The conventional method to solve this problem comprises forming the conductive layer 13 by flame-spraying Cu all over the ceramic layer 12 also formed by flame-spray, immersing the ceramic layer 12 and conductive layer 13 with thermosetting resin to fill through pores therein, polishing the surface of conductive layer 13, selectively printing etching resist on the conductive layer 13, and selectively etching the conductive layer 13. According to this method, however, etching time is made long because of conductive layer 13 immersed with thermosetting resin and takes substantially five times as compared with that in the case where no thermosetting resin is contained.

SUMMARY OF THE INVENTION

The present invention is intended to eliminate these drawbacks and the object of the present invention is therefore to provide a method for manufacturing a hybrid integrated circuit device excellent in mechanical strength, heat radiating characteristics and high dielectric strength, and easily manufactured at low cost.

According to the present invention there is provided a method for manufacturing a hybrid integrated circuit device comprising a step of forming a ceramic layer on a metal substrate, a step of forming on said ceramic layer a resist layer having a pattern opposite to that of a conductive layer which will be formed on said ceramic layer by a later step, a step of forming the conductive layer on said ceramic layer using said resist layer as a mask, a step of impregnating thermosetting material into both said ceramic layer and said conductive layer, and a step of providing at least one semiconductor element on said conductive layer.

BRIEF DESCRIPTION OF THE DRAWINGS

FIGS. 5A through 5H show each of the steps employed in an example of the method for manufacturing a hybrid integrated circuit device according to the present invention;

FIG. 6 shows a variation of one of steps shown in FIGS. 5A to 5H; and

FIG. 7 is a sectional view showing a hybrid integrated circuit device having a multi-layer structure and manufactured according to the method of the present invention.

DETAILED DESCRIPTION OF THE PREFERRED EMBODIMENT

An embodiment of the manufacturing method according to the present invention will be described in detail referring to FIGS. 5A through 5H.

Figure 1:
FIG. 1 shows an example of a conventional base plate employed in the hybrid integrated circuit device.
Figure 2:
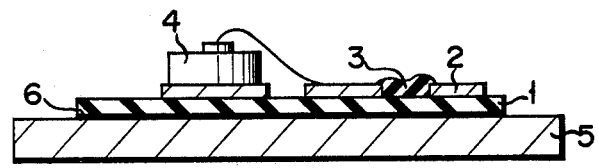
FIG. 2 shows the base plate of FIG. 1 having a power element arranged thereon.
Figure 3:
FIG. 3 shows another arrangement of a conventional base plate.
Figure 4:
FIG. 4 shows the base plate of FIG. 3 having a conductive layer formed thereon.
Figure 5A:
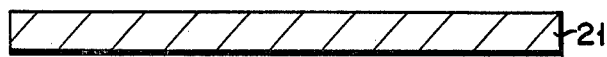

Coarse particles of $Al_2O_3$ are sprayed onto the surface of a pure aluminum plate 21 having a thickness of about 2 mm and functioning as a heat radiating metal plate to form an uneven layer of 20–30$\mu$ thereon (FIG. 5A). This uneven layer is extremely thin as compared with the plate 21 and therefore omitted in FIG. 5A to enhance the clarity of the drawing.

Figure 5B:

Using a plasma flame spray device (not shown), powdered particles of $Al_2O_3$ whose diameter ranges from 10$\mu$ to 40$\mu$ are flame-sprayed 100–150$\mu$ thick on the uneven surface of aluminum plate 21 to form a ceramic layer 22 of $Al_2O_3$ (FIG. 5B).

Figure 5C:

Resist is printed on the ceramic layer 22 in a pattern or negative pattern reverse to a desired pattern of a conductive layer and dried at about 125° C. and for about ten minutes to form a resist layer 23 having the pattern reverse to that of the desired conductive layer (FIG. 5C).

Figure 5D:

Powder of Cu whose particle diameters range from 15$\mu$ to 40$\mu$, for example, is flame-sprayed by means of a flame spray device (not shown) on the ceramic layer 22 using the resist layer 23 as a mask. Flame-sprayed Cu powder is repelled by the resist layer 23 and not deposited on the resist layer 23. Therefore, no Cu layer (or conductive layer) is formed on the resist layer 23. The Cu layer 24 is formed only on the ceramic layer 22 (FIG. 5D).

Figure 5E:

The resist layer 23 is removed using trichlene solvent, for example (FIG. 5E).

Keeping the thus formed structure mounted on a heat plate (not shown) heated about 60° C., thermosetting epoxy resin is uniformly coated all over the ceramic layer 22 and conductive layer 24. After the structure is left for three minutes to allow the epoxy resin to impregnate the ceramic layer 22 and conductive layer 24, epoxy resin left on the surfaces of ceramic layer 22 and conductive layer 24 is wiped off. The heat plate is heated to about 150° C. and the structure mounted on the heat plate is left for about thirty minutes as it is. The heat plate is further heated to about 180° C. and the structure mounted on the heat plate is then left for about thirty minutes as it is, to thereby harden the epoxy resin that impregnated the ceramic layer 22 and conductive layer 24 (FIG. 5F). Epoxy resin still left on the conductive layer 24 is removed therefrom by lightly polishing with a sheet of sand paper.

A solder cream 25 is selectively printed on the conductive layer 24 of a base plate thus formed (FIG. 5G).

A power transistor 26, a small signal transistor 27, a chip capacitor 28 and so on are mounted as power elements on the conductive layer 24 on which the solder cream 25 has been printed, preheated at about 150° C. for about fifteen seconds and then heated at about 230° C. for about fifteen seconds to solve the solder cream and to solder each of elements 26, 27 and 28 to the base plate (FIG. 5H).

A hybrid integrated circuit device is thus manufactured.

According to the above-described manufacturing method, the resist layer 23 is formed on the ceramic layer 23 in the pattern reverse to the desired one of conductive layer 24, which is formed on the ceramic layer 22 in the desired pattern using as a mask the resist layer 23 having the pattern reverse to that of conductive layer 24. No etching is therefore needed relative to the conductive layer 24 to thereby make the method simple and reduce the processing time to a great extent. In addition, impregnation of epoxy resin into the ceramic layer 22 and conductive layer 24 is carried out by the same process to thereby make the method simple, too. Further, the method of the present invention causes no reduction of deposited strength between the ceramic layer and the conductive layer, although such reduction was caused by the conventional method by which epoxy resin was impregnated into the ceramic layer and subsequently the conductive layer was then formed on the ceramic layer. Furthermore, the ceramic layer 22 formed by flame spray can be made extremely thin having a thickness of about 100–500μ to thereby provide a device having a high heat radiating characteristic. Still furthermore, the ceramic layer 22 is impregnated with thermosetting resin, as described above, to fill through pores among particles which form the ceramic layer 22, thus making the insulating capacity of ceramic layer 22 high to increase the dielectric strength of the device in such a way that the dielectric strength of the device is not reduced so greatly even when the device is used under severe conditions, such as a temperature of 60° C. and humidity of 90%. According to the experiment, the device manufactured according to the above-described method was not insulatingly broken even when it was subjected to the dielectric strength test in which the applied DC voltage was 3 kV and the application time was 60 seconds.

When it is feared that the center portion of conductive layer 24 is not impregnated with thermosetting epoxy resin because the area of conductive layer 24 is wide, a small hole 29 formed, as shown in FIG. 6, in the center portion of conductive layer 24 will allow the whole wide area of conductive layer 24 to be uniformly impregnated with epoxy resin. FIG. 6 is a plan view showing the device shown in FIG. 5E. The hole 29 can be formed in such a way that resist is also printed at the resist layer forming step on the position where the hole 29 is to be formed, and then removed during the resist layer removing step.

According to the above-described embodiment of the present invention, the conductive layer 24 is formed at first and the resist layer 23 is then removed. However, no problem is caused even when this resist layer 23 is not removed but left as it is.

Also according to the embodiment of the present invention, the ceramic layer is made of $Al_2O_3$ but it is not limited to $Al_2O_3$. It may be made of, for example, $MgO \cdot SiO_2$ (steatite), $2MgO \cdot SiO_2$ (forsterite), $ZrO_2 \cdot SiO_2$ (zircon), MgO (magnesia), BeO (beryllia or beryllium oxide), or $TiO_2$ (titanium oxide).

Epoxy resin is employed in the embodiment of the present invention as a resin to be impregnated, but other resins having characteristics suitable for filling through pores such as thermosetting acrylic resin, thermosetting polyurethane resin, diaryl phthalate resin, thermosetting polybutadiene resin, silicone resin, thermosetting polyimide resin and bismaleimide resin, for example, may be used. Some of these resins may be mixed with one another or one of these resins may be blended with a multifunctionality monomer of low molecular weight. Copper is used as a material of which the conductive layer 24 is made, but any optional metal may be used. It is preferable in this case that the metal has high conductivity.

Although the present invention is applied to manufacturing the device of so-called single layer structure in which the single conductive layer 24 is formed on the single ceramic layer 22, it can also be applied similarly to manufacturing the device of so-called multi-layer structure in which plural insulation layers and plural conductive layers are alternately formed one upon the other.

A device shown in FIG. 7 is manufactured by applying the present invention to provide a hybrid integrated circuit device of such a multi-layer structure.

The device shown in FIG. 7 is substantially the same in structure as the one shown in FIG. 5H except that the former has a multi-layer construction formed by two ceramic layers and two conductive layers. Therefore, the same portions as those in the device shown in FIG. 5H are denoted by the same reference numerals and the description of these portions will be omitted.

In the case of the device shown in FIG. 7, a second ceramic layer 31 is formed by flame-spraying $Al_2O_3$ on the conductive layer 24 and a second conductive layer 32 is formed by flame-spraying Cu on the second ceramic layer 31. The second conductive layer 32 is in contact with the first conductive layer 24 via throughholes formed in the second ceramic layer 31. A power element 33 and a small-signal transistor 34 are fixed by soldering, for example, on the conductive layer 32.

The second ceramic layer 31 is formed by forming the resist layer on the first conductive layer 24 in a predetermined pattern and then flame-spraying powder of $Al_2O_3$ on the first conductive layer 24 using the resist layer as a mask. The second conductive layer 32 is formed, similarly to the case where the device of single-layer structure is manufactured, by forming on the second ceramic layer 31 a second resist layer having a pattern or a negative pattern reverse to the desired one of the conductive layer after the resist layer used as the mask to form the second ceramic layer 31 is removed, and then flame-spraying Cu on the second ceramic layer 31 using this second resist layer as a mask. After the second ceramic layer 31 and the second conductive layer 32 are formed, they are impregnated, similarly to the case where the device of single-layer structure is manufactured, with thermosetting epoxy resin to fill through pores among particles in each of them. Impregnation of epoxy resin into the first ceramic and conductive layers 22 and 24 and into the second ceramic and conductive layers 31 and 32 need be carried out by different steps but may be carried out by the same step after layers 22, 24, 31 and 32 are all formed. The condition under which impregnation is carried out in this case is different from that of the already-described impregnation. Longer heating and impregnating times are needed. However, impregnation can be achieved by one step this time to thereby make the method simple.

Needless to say, the same results attained in the case where the device of a single-layer structure is manufactured can also be achieved in the case where the device of this multi-layer structure is manufactured.

Similarly to the case of the first ceramic layer 22, the material of which the second ceramic layer 31 is made is not limited to $Al_2O_3$ but various materials already mentioned may be employed. The resin which impregnates layers 31 and 32 is not limited to epoxy resin but various resins already mentioned referring to the device of single layer structure may be used. The material of which the second conductive layer 32 is made is not limited to copper but any optional metal may be used. However, it is preferable in this case that the metal has high conductivity.

As apparent from the above, the present invention provides a method for manufacturing a hybrid integrated circuit device excellent in mechanical strength, heat radiating characteristics and dielectric strength. The method of the present invention also allows such hybrid integrated circuit devices to be easily manufactured.

It should be understood that the present invention is not limited to the above-described embodiment but that various changes and modifications can be made without departing from the scope and spirit of the present invention.

What we claim is:

1. A method for manufacturing a hybrid integrated circuit device comprising the following steps in the stated order:
    a step of forming a ceramic layer on a metal substrate by flame-spraying a ceramic material onto the metal substrate;
    a step of forming on said ceramic layer a resist layer having a pattern opposite to that of a conductive layer which will be formed on said ceramic layer by a later step;
    a step of forming the conductive layer by flame-spraying a conductive material on said ceramic layer using said resist layer as a mask;
    a step of impregnating thermosetting insulative material into both said ceramic layer and said conductive layer; and
    a step of providing at least one semiconductor element on said conductive layer.

2. A method for manufacturing a hybrid integrated circuit device according to claim 1 further including a step of removing the resist layer after the step of forming the conductive layer.

3. A method for manufacturing a hybrid integrated circuit device according to claim 1 wherein said ceramic material is a selected one of $Al_2O_3$, $MgO.SiO_2$, $2MgO.SiO_2$, $ZrO_2.SiO_2$, $MgO$, $BeO$ and $TiO_2$.

4. A method for manufacturing a hybrid integrated circuit device according to claim 1 wherein said conductive material is a metal material.

5. A method for manufacturing a hybrid integrated circuit device according to claim 4 wherein said metal material is copper.

6. A method for manufacturing a hybrid integrated circuit device according to claim 2, wherein said conductive material is a metal material.

* * * * *